(12) United States Patent
Stephenson

(10) Patent No.: US 11,664,459 B2
(45) Date of Patent: May 30, 2023

(54) METHOD FOR MAKING AN INVERTED T CHANNEL FIELD EFFECT TRANSISTOR (ITFET) INCLUDING A SUPERLATTICE

(71) Applicant: ATOMERA INCORPORATED, Los Gatos, CA (US)

(72) Inventor: Robert John Stephenson, Duxford (GB)

(73) Assignee: ATOMERA INCORPORATED, Los Gatos, CA (US)

(*) Notice: Subject to any disclaimer, the term of this patent is extended or adjusted under 35 U.S.C. 154(b) by 924 days.

(21) Appl. No.: 16/380,142

(22) Filed: Apr. 10, 2019

(65) Prior Publication Data

US 2019/0319135 A1 Oct. 17, 2019

Related U.S. Application Data

(60) Provisional application No. 62/656,460, filed on Apr. 12, 2018.

(51) Int. Cl.
*H01L 29/786* (2006.01)
*H01L 21/306* (2006.01)
(Continued)

(52) U.S. Cl.
CPC .. *H01L 29/78687* (2013.01); *H01L 21/02587* (2013.01); *H01L 21/308* (2013.01);
(Continued)

(58) Field of Classification Search
CPC ......... H01L 21/02507; H01L 21/02587; H01L 21/30604; H01L 21/308; H01L 21/7624;
(Continued)

(56) References Cited

U.S. PATENT DOCUMENTS

| 4,907,048 A | 3/1990 | Huang |
| 4,937,204 A | 6/1990 | Ishibashi et al. |

(Continued)

FOREIGN PATENT DOCUMENTS

GB 2347520 6/2000

OTHER PUBLICATIONS

U.S. Appl. No. 15/842,981, filed Dec. 15, 2017 Chen et al.
(Continued)

*Primary Examiner* — Herve-Louis Y Assouman
*Assistant Examiner* — Christopher M Roland
(74) *Attorney, Agent, or Firm* — Allen, Dyer, Doppelt + Gilchrist, P.A. Attorney at Law

(57) ABSTRACT

A method for making a semiconductor device may include forming an inverted T channel on a substrate, with the inverted T channel comprising a superlattice. The superlattice may include a plurality of stacked groups of layers, with each group of layers comprising a plurality of stacked base semiconductor monolayers defining a base semiconductor portion, and at least one non-semiconductor monolayer constrained within a crystal lattice of adjacent base semiconductor portions. The method may further include forming source and drain regions on opposing ends of the inverted T channel, and forming a gate overlying the inverted T channel between the source and drain.

24 Claims, 10 Drawing Sheets

(51) Int. Cl.
*H01L 29/06* (2006.01)
*H01L 29/15* (2006.01)
*H01L 21/02* (2006.01)
*H01L 21/308* (2006.01)
*H01L 21/762* (2006.01)
*H01L 29/66* (2006.01)
*H01L 29/78* (2006.01)
*H01L 29/10* (2006.01)

(52) U.S. Cl.
CPC .... *H01L 21/30604* (2013.01); *H01L 21/7624* (2013.01); *H01L 29/0649* (2013.01); *H01L 29/1054* (2013.01); *H01L 29/152* (2013.01); *H01L 29/66742* (2013.01); *H01L 29/66795* (2013.01); *H01L 29/7853* (2013.01); *H01L 29/78696* (2013.01); *H01L 21/02507* (2013.01); *H01L 2924/13066* (2013.01)

(58) Field of Classification Search
CPC . H01L 29/0649; H01L 29/1054; H01L 29/15; H01L 29/151; H01L 29/152; H01L 29/66742; H01L 29/66795; H01L 29/7853; H01L 29/78687; H01L 29/78696; H01L 2924/13066
See application file for complete search history.

(56) References Cited

U.S. PATENT DOCUMENTS

| | | | |
|---|---|---|---|
| 4,994,873 A | 2/1991 | Madan | |
| 5,216,262 A | 6/1993 | Tsu | |
| 5,357,119 A | 10/1994 | Wang et al. | |
| 5,683,934 A | 11/1997 | Candelaria | |
| 5,796,119 A | 8/1998 | Seabaugh | |
| 5,880,015 A | 3/1999 | Hata | |
| 6,141,361 A | 10/2000 | Mears et al. | |
| 6,376,337 B1 | 4/2002 | Wang et al. | |
| 6,472,685 B2 | 10/2002 | Takagi | |
| 6,475,890 B1 | 11/2002 | Yu | |
| 6,741,624 B2 | 5/2004 | Mears et al. | |
| 6,830,964 B1 | 12/2004 | Mears et al. | |
| 6,833,294 B1 | 12/2004 | Mears et al. | |
| 6,878,576 B1 | 4/2005 | Mears et al. | |
| 6,891,188 B2 | 5/2005 | Mears et al. | |
| 6,897,472 B2 | 5/2005 | Mears et al. | |
| 6,927,413 B2 | 8/2005 | Mears et al. | |
| 6,952,018 B2 | 10/2005 | Mears et al. | |
| 6,958,486 B2 | 10/2005 | Mears et al. | |
| 6,960,517 B2 | 11/2005 | Rios et al. | |
| 6,993,222 B2 | 1/2006 | Mears et al. | |
| 7,018,900 B2 | 3/2006 | Kreps | |
| 7,033,437 B2 | 4/2006 | Mears et al. | |
| 7,034,329 B2 | 4/2006 | Mears et al. | |
| 7,045,377 B2 | 5/2006 | Mears et al. | |
| 7,045,813 B2 | 5/2006 | Mears et al. | |
| 7,071,119 B2 | 7/2006 | Mears et al. | |
| 7,105,895 B2 | 9/2006 | Wang et al. | |
| 7,109,052 B2 | 9/2006 | Mears et al. | |
| 7,123,792 B1 | 10/2006 | Mears et al. | |
| 7,148,712 B1 | 12/2006 | Prey, Jr. et al. | |
| 7,153,763 B2 | 12/2006 | Hytha et al. | |
| 7,202,494 B2 | 4/2007 | Blanchard et al. | |
| 7,227,174 B2 | 6/2007 | Mears et al. | |
| 7,229,902 B2 | 6/2007 | Mears et al. | |
| 7,265,002 B2 | 9/2007 | Mears et al. | |
| 7,279,699 B2 | 10/2007 | Mears et al. | |
| 7,279,701 B2 | 10/2007 | Kreps | |
| 7,288,457 B2 | 10/2007 | Kreps | |
| 7,303,948 B2 | 12/2007 | Mears et al. | |
| 7,432,524 B2 | 10/2008 | Mears et al. | |
| 7,435,988 B2 | 10/2008 | Mears et al. | |
| 7,436,026 B2 | 10/2008 | Kreps | |
| 7,446,002 B2 | 11/2008 | Mears et al. | |
| 7,446,334 B2 | 11/2008 | Mears et al. | |
| 7,456,476 B2 | 11/2008 | Hareland et al. | |
| 7,491,587 B2 | 2/2009 | Rao | |
| 7,514,328 B2 | 4/2009 | Rao | |
| 7,517,702 B2 | 4/2009 | Halilov et al. | |
| 7,531,828 B2 | 5/2009 | Mears et al. | |
| 7,531,829 B2 | 5/2009 | Blanchard | |
| 7,531,850 B2 | 5/2009 | Blanchard | |
| 7,586,116 B2 | 9/2009 | Kreps et al. | |
| 7,586,165 B2 | 9/2009 | Blanchard | |
| 7,598,515 B2 | 10/2009 | Mears et al. | |
| 7,612,366 B2 | 11/2009 | Mears et al. | |
| 7,625,767 B2 | 12/2009 | Huang et al. | |
| 7,659,539 B2 | 2/2010 | Kreps et al. | |
| 7,700,447 B2 | 4/2010 | Dukovski et al. | |
| 7,718,996 B2 | 5/2010 | Dukovski et al. | |
| 7,781,827 B2 | 8/2010 | Rao | |
| 7,812,339 B2 | 10/2010 | Mears et al. | |
| 7,863,066 B2 | 1/2011 | Mears et al. | |
| 7,880,161 B2 | 2/2011 | Mears et al. | |
| 7,928,425 B2 | 4/2011 | Rao | |
| 8,158,484 B2 | 4/2012 | Orlowski et al. | |
| 8,389,974 B2 | 3/2013 | Mears et al. | |
| 9,275,996 B2 | 3/2016 | Mears et al. | |
| 9,406,753 B2 | 8/2016 | Mears et al. | |
| 9,558,939 B1 | 1/2017 | Stephenson et al. | |
| 9,899,479 B2 | 2/2018 | Mears et al. | |
| 9,941,359 B2 | 4/2018 | Mears et al. | |
| 9,972,685 B2 | 5/2018 | Mears et al. | |
| 10,084,045 B2 | 9/2018 | Mears et al. | |
| 10,107,854 B2 | 10/2018 | Roy | |
| 10,109,342 B2 | 10/2018 | Roy | |
| 10,109,479 B1 | 10/2018 | Mears et al. | |
| 10,170,560 B2 | 1/2019 | Mears | |
| 10,170,603 B2 | 1/2019 | Mears et al. | |
| 10,170,604 B2 | 1/2019 | Mears et al. | |
| 10,191,105 B2 | 1/2019 | Roy | |
| 2003/0034529 A1 | 2/2003 | Fitzgerald et al. | |
| 2003/0057416 A1 | 3/2003 | Currie et al. | |
| 2004/0262699 A1* | 12/2004 | Rios | H01L 29/66795 438/197 |
| 2005/0279991 A1 | 12/2005 | Mears et al. | |
| 2006/0011905 A1* | 1/2006 | Mears | H01L 29/513 257/18 |
| 2006/0220118 A1 | 10/2006 | Stephenson et al. | |
| 2006/0267130 A1 | 11/2006 | Rao | |
| 2006/0292889 A1* | 12/2006 | Blanchard | H01L 29/7833 257/E29.063 |
| 2007/0012910 A1 | 1/2007 | Mears et al. | |
| 2007/0020833 A1 | 1/2007 | Mears et al. | |
| 2008/0012004 A1 | 1/2008 | Huang et al. | |
| 2008/0258134 A1 | 10/2008 | Mears et al. | |
| 2011/0215299 A1 | 9/2011 | Rao | |
| 2015/0357414 A1 | 12/2015 | Mears | |
| 2016/0149023 A1 | 5/2016 | Mears et al. | |
| 2016/0358773 A1 | 12/2016 | Mears et al. | |
| 2018/0040724 A1 | 2/2018 | Mears et al. | |
| 2018/0040725 A1 | 2/2018 | Mears et al. | |
| 2018/0337063 A1 | 11/2018 | Takeuchi | |
| 2018/0337064 A1 | 11/2018 | Takeuchi | |
| 2018/0358361 A1 | 12/2018 | Rao | |
| 2018/0358442 A1 | 12/2018 | Rao | |
| 2019/0057896 A1 | 2/2019 | Stephenson et al. | |
| 2019/0058059 A1 | 2/2019 | Stephenson et al. | |
| 2019/0319136 A1* | 10/2019 | Stephenson | H01L 29/151 |
| 2019/0319167 A1* | 10/2019 | Stephenson | H01L 21/02507 |
| 2020/0075327 A1 | 3/2020 | Weeks et al. | |

OTHER PUBLICATIONS

U.S. Appl. No. 15/842,989, filed Dec. 15, 2017 Mears et al.
U.S. Appl. No. 15/842,990, filed Dec. 15, 2017 Chen et al.
U.S. Appl. No. 15/842,993, filed Dec. 15, 2017 Chen et al.
U.S. Appl. No. 15/843,013, filed Dec. 15, 2017 Mears et al.
U.S. Appl. No. 15/843,017, filed Dec. 15, 2017 Chen et al.
U.S. Appl. No. 15/843,044, filed Dec. 15, 2017 Chen et al.
U.S. Appl. No. 15/843,077, filed Dec. 15, 2017 Chen et al.
U.S. Appl. No. 15/843,106, filed Dec. 15, 2017 Chen et al.

(56) References Cited

OTHER PUBLICATIONS

U.S. Appl. No. 15/843,113, filed Dec. 15, 2017 Chen et al.
U.S. Appl. No. 15/843,121, filed Dec. 15, 2017 Chen et al.
U.S. Appl. No. 15/843,136, filed Dec. 15, 2017 Chen et al.
U.S. Appl. No. 15/916,766, filed Mar. 9, 2018 Weeks et al.
U.S. Appl. No. 15/916,831, filed Mar. 9, 2018 Weeks et al.
U.S. Appl. No. 16/117,178, filed Aug. 30, 2018 Weeks et al.
U.S. Appl. No. 16/117,202, filed Aug. 30, 2018 Weeks et al.
U.S. Appl. No. 16/176,005, filed Oct. 31, 2018 Weeks et al.
U.S. Appl. No. 16/192,897, filed Nov. 16, 2018 Connelly et al.
U.S. Appl. No. 16/192,911, filed Nov. 16, 2018 Takeuchi et al.
U.S. Appl. No. 16/192,923, filed Nov. 16, 2018 Takeuchi et al.
U.S. Appl. No. 16/192,930, filed Nov. 16, 2018 Takeuchi et al.
U.S. Appl. No. 16/192,941, filed Nov. 16, 2018 Takeuchi et al.
U.S. Appl. No. 16/192,959, filed Nov. 16, 2018 Takeuchi et al.
U.S. Appl. No. 16/192,987, filed Nov. 16, 2018 Takeuchi et al.
U.S. Appl. No. 16/193,000, filed Nov. 16, 2018 Takeuchi et al.
U.S. Appl. No. 16/193,011, filed Nov. 16, 2018 Takeuchi et al.
U.S. Appl. No. 16/296,400, filed Mar. 8, 2019 Stephenson et al.
U.S. Appl. No. 16/296,414, filed Mar. 8, 2019, Stephenson et al.
Luo et al., "Chemical Design of Direct-Gap Light-Emitting Silicon" published in Physical Review Letters, vol. 89, No. 7; Aug. 12, 2002; 4 pgs.
Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.
Novikov et al. "Silicon-based Optoelectronics" 1999-2003, pp. 1-6.
R. Tsu Phenomena in silicon nanostructure device published online Sep. 6, 2000 by Applied Physics and Materials Science & Processing, pp. 391-402.
R. Tsu "Si Based Green ELD: Si-Oxygen Superlattice" wysiwyg://1/http://www3.interscience.wiley.com/egi-bin/abstract/72512946/start: published online Jul. 21, 2000; 2 pgs. Abstract Only.
Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016.
Xu et al. "Extension of planar bulk n-channel MOSFET scaling with oxygen insertion technology" IEEE Transactions on Electron devices, vol. 61, No. 9; Sep. 2014. pp. 3345-3349.
Xu et al., "MOSFET performance and scalability enhancement by insertion of oxygen layers", Department of Electrical Engineering and Computer Science, University of California, Berkeley, 2012, pp. 1-4.
Mathew et al. "ITFET: Inverted T Channel FET, A Novel Device architecture and circuits based on the ITFET" IEEE: 2006; 1-4244-0098-8/06; pp. 4.
U.S. Appl. No. 16/380,091, filed Apr. 10, 2019 Robert Stephenson.
U.S. Appl. No. 16/380,111, filed Apr. 10, 2019 Robert Stephenson.
U.S. Appl. No. 16/380,149, filed Apr. 10, 2019 Robert Stephenson.

* cited by examiner

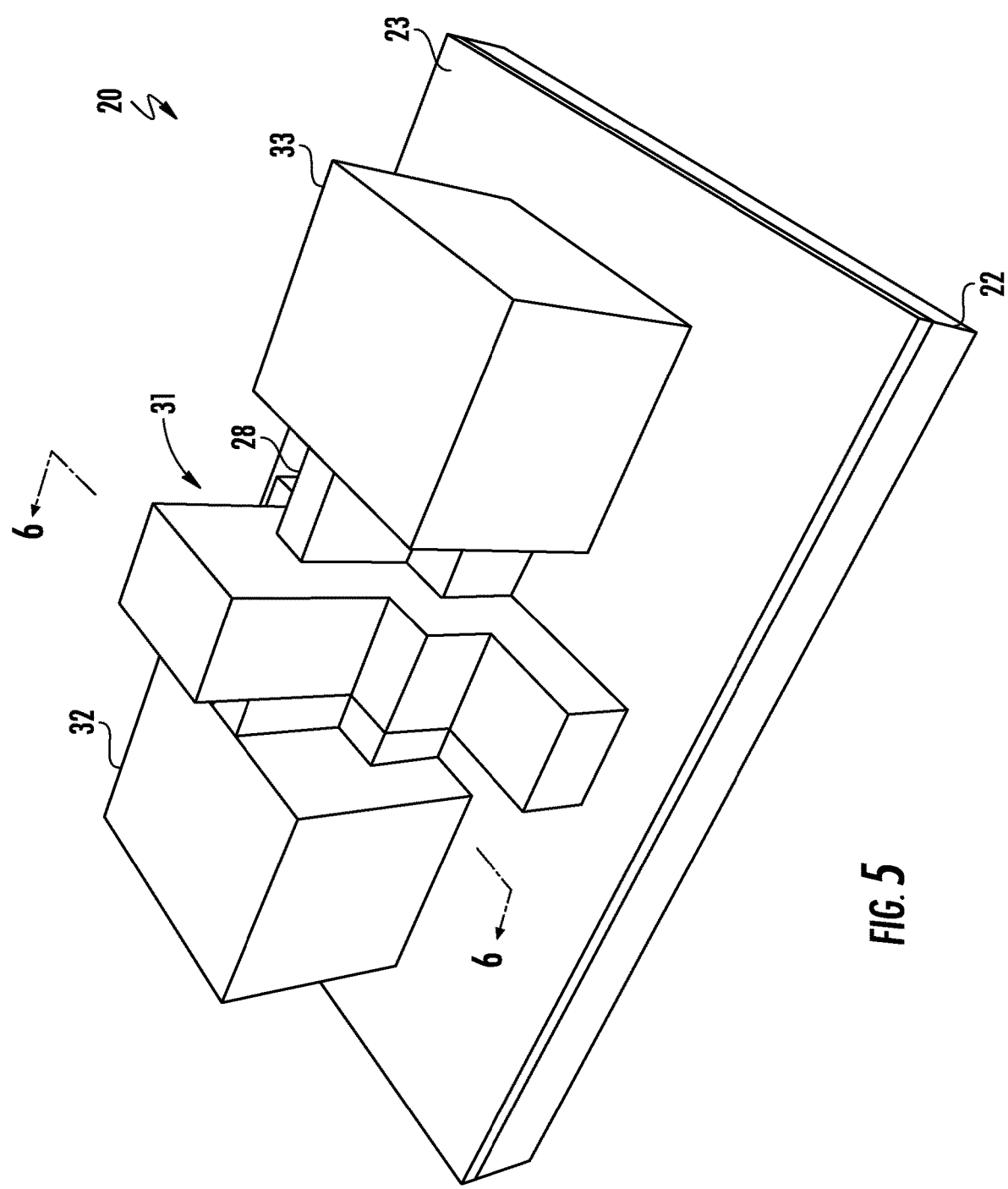

METHOD FOR MAKING AN INVERTED T CHANNEL FIELD EFFECT TRANSISTOR (ITFET) INCLUDING A SUPERLATTICE

RELATED APPLICATIONS

This application claims the benefit of provisional application Ser. No. 62/656,460 filed Apr. 12, 2018, which is hereby incorporated herein in its entirety by reference.

TECHNICAL FIELD

The present invention relates to the field of semiconductors, and, more particularly, to semiconductor devices comprising superlattices and associated methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

U.S. Pat. No. 6,376,337 to Wang et al. discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor processing techniques in certain applications.

SUMMARY

A method for making a semiconductor device may include forming an inverted T channel on a substrate, with the inverted T channel comprising a superlattice. The superlattice may include a plurality of stacked groups of layers, with each group of layers comprising a plurality of stacked base semiconductor monolayers defining a base semiconductor portion, and at least one non-semiconductor monolayer constrained within a crystal lattice of adjacent base semiconductor portions. The method may further include forming source and drain regions on opposing ends of the inverted T channel, and forming a gate overlying the inverted T channel between the source and drain regions.

More particularly, forming the inverted T channel may further include forming the superlattice on the substrate, etching the superlattice to define a fin therein, forming sidewall spacers on opposite sides of the fin, etching portions of the superlattice laterally outside of the sidewall spacers to define the inverted T channel, and removing the sidewall spacers.

In an example embodiment, the substrate may comprise a semiconductor-on-insulator (SOI) substrate. Forming the gate may include forming a gate insulator overlying the superlattice channel layer, and forming a gate electrode overlying the gate insulator. By way of example, each base semiconductor portion may comprise a base semiconductor selected from the group consisting of Group IV semiconductors, Group III-V semiconductors, and Group II-VI semiconductors. Furthermore, the at least one non-semiconductor monolayer may comprise a non-semiconductor selected from the group consisting of oxygen, nitrogen, fluorine, and carbon-oxygen. For example, the base semiconductor monolayers may comprise silicon, and the at least one non-semiconductor monolayer may comprise oxygen.

In some example embodiments, all of the base semiconductor portions may be a same number of monolayers thick. In other example embodiments, at least some of the base semiconductor portions may be a different number of monolayers thick.

BRIEF DESCRIPTION OF THE DRAWINGS

FIG. 5 is a schematic cross-sectional diagram of an ITFET including a superlattice in accordance with the invention.

DETAILED DESCRIPTION OF THE PREFERRED EMBODIMENTS

Figure 1:
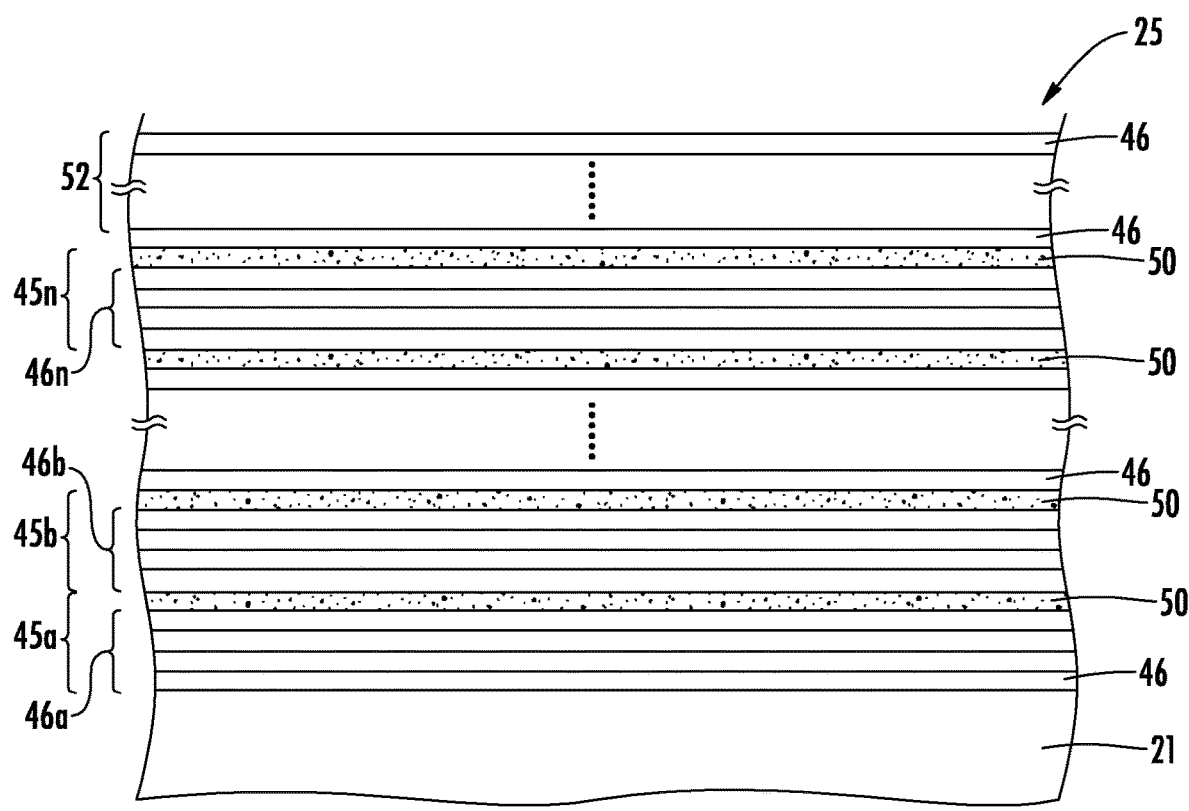
FIG. 1 is a greatly enlarged schematic cross-sectional view of a superlattice for use in a semiconductor device in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present embodiments relate to controlling the properties of semiconductor materials at the atomic or molecular level. Further, the embodiments relate to the identification, creation, and use of improved materials for use in semiconductor devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) =$$

$$\frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicants have identified improved materials or structures for use in semiconductor devices. More specifically, the Applicants have identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
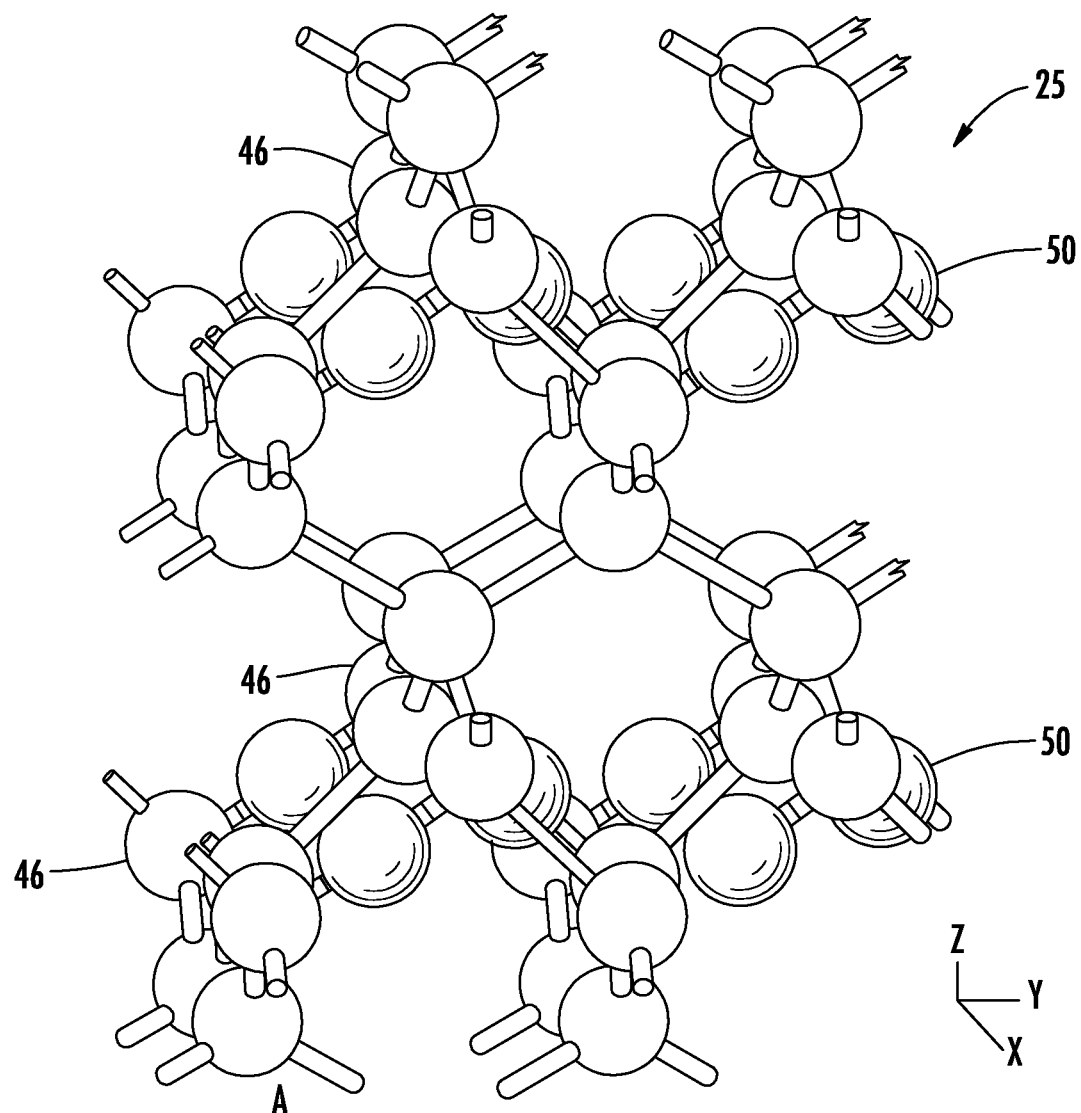
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation on a substrate 21, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46.

The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons or holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
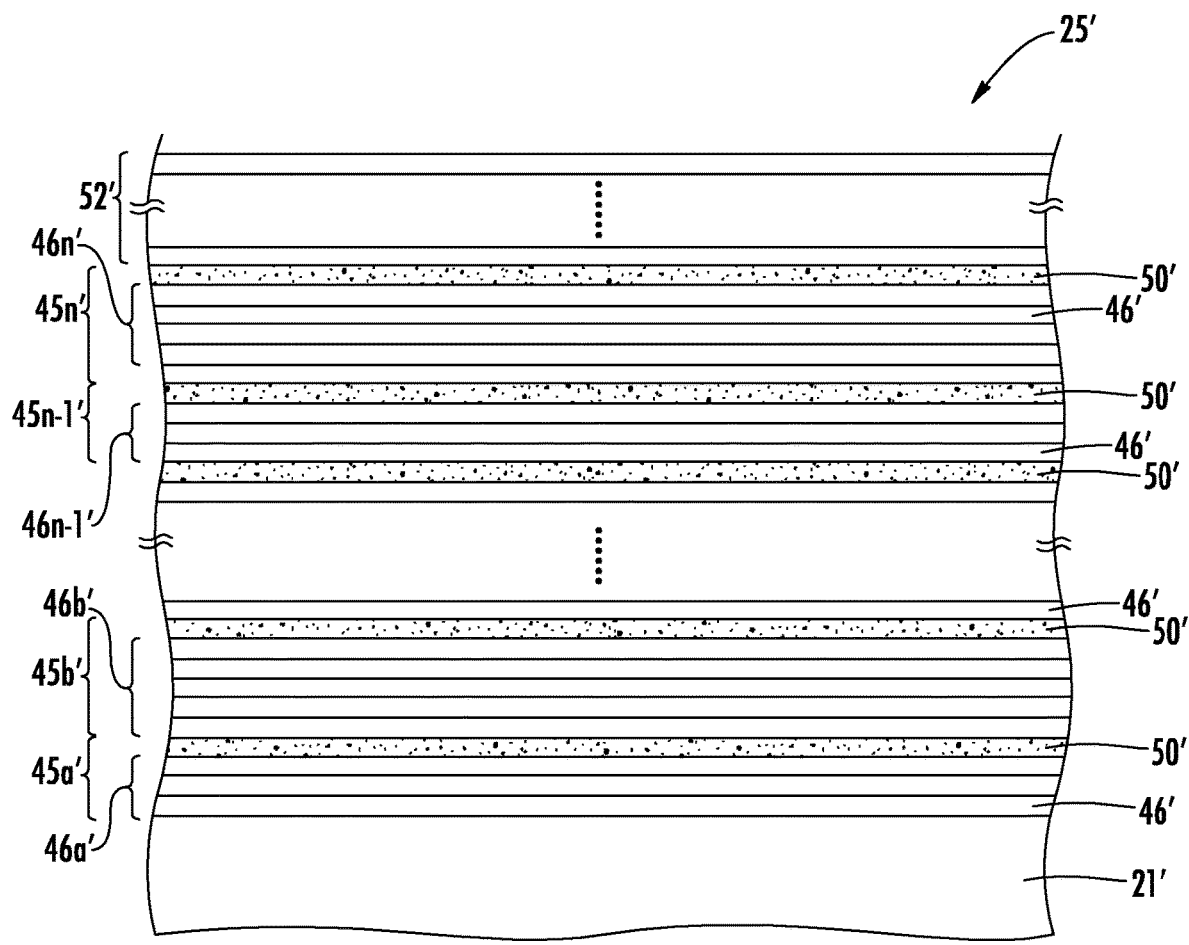
FIG. 3 is a greatly enlarged schematic cross-sectional view of another embodiment of a superlattice in accordance with the invention.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers on the substrate 21', and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Each group of layers 45a'-45n of the superlattice 25' illustratively includes plurality of stacked base semiconductor monolayers 46' defining a respective base semiconductor portion 46a'-46n' and an energy band-modifying layer 50' thereon, The superlattice 25' also illustratively includes a cap layer 52' on an upper layer group 45n'.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
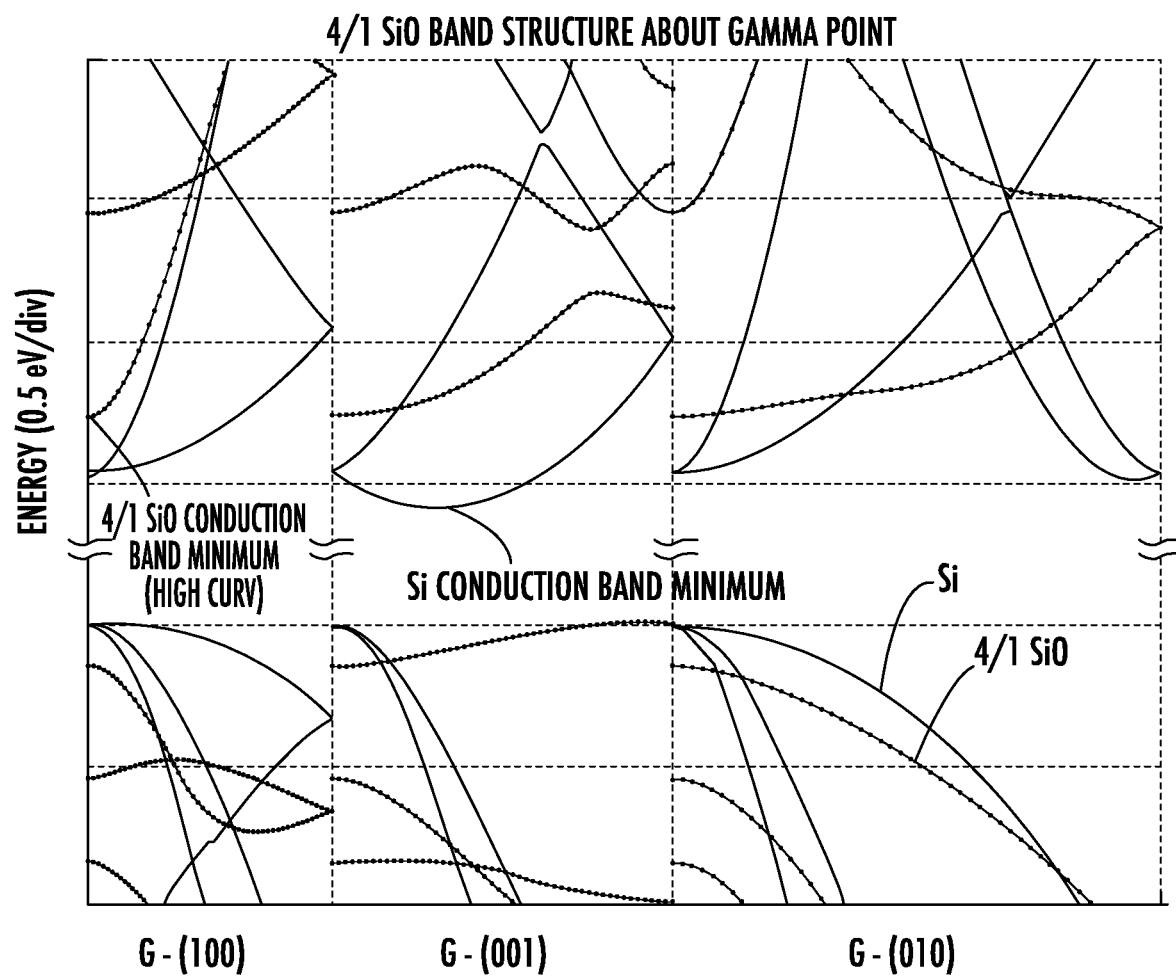
FIG. 4A is a graph of the calculated band structure from the gamma point (G) for both bulk silicon as in the prior art, and for the 4/1 Si/O superlattice as shown in FIGS. 1-2.
Figure 4B:
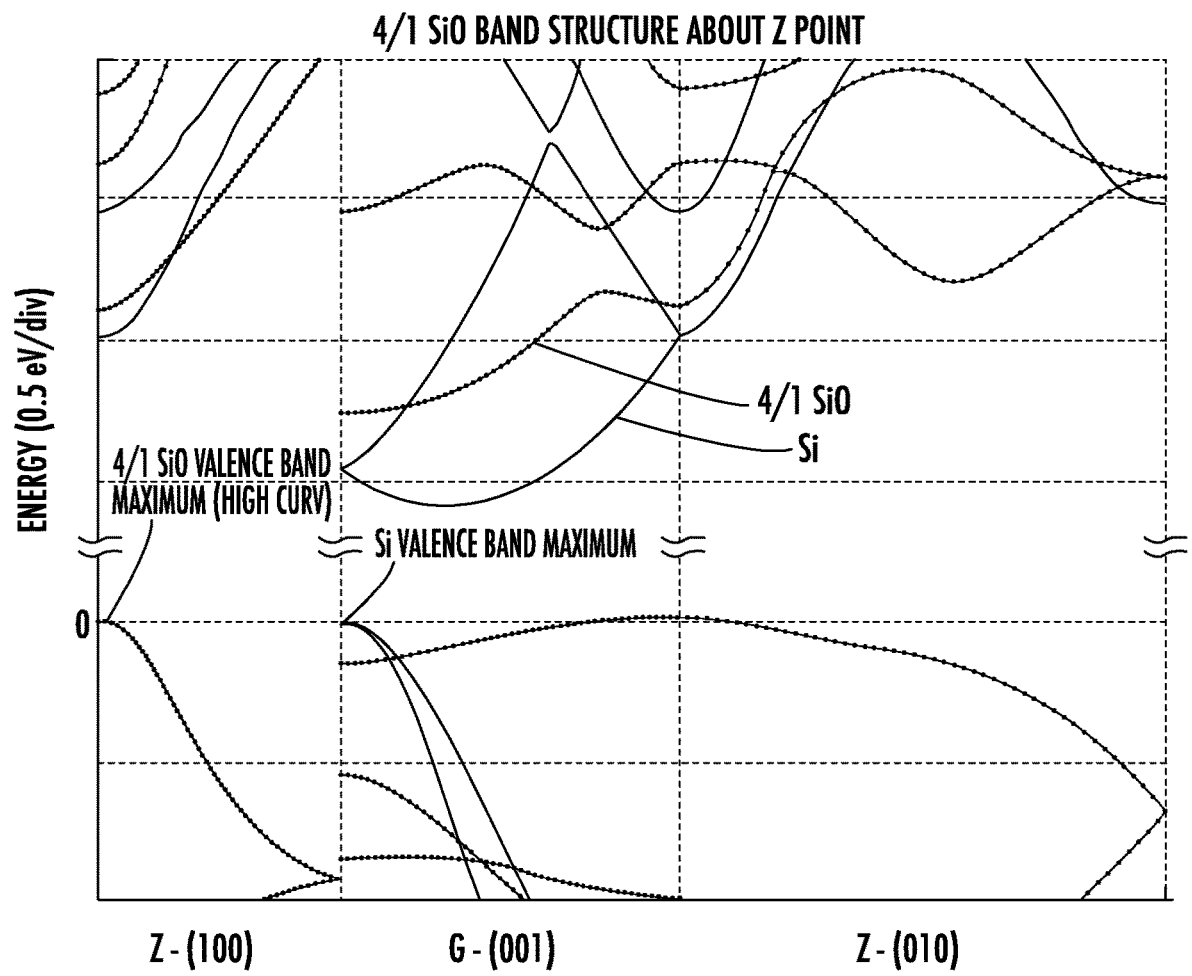
FIG. 4B is a graph of the calculated band structure from the Z point for both bulk silicon as in the prior art, and for the 4/1 Si/O superlattice as shown in FIGS. 1-2.
Figure 4C:
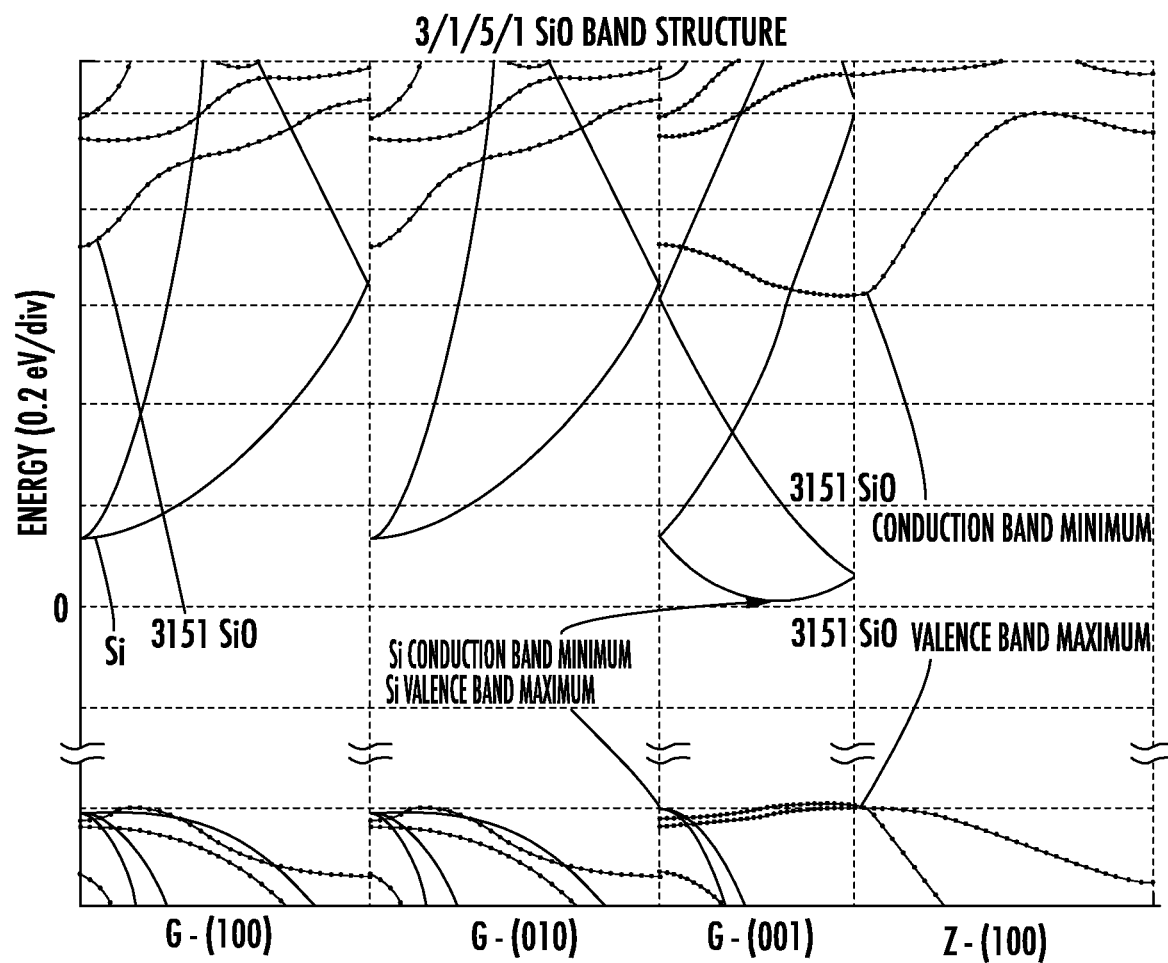
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (-110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 6A:
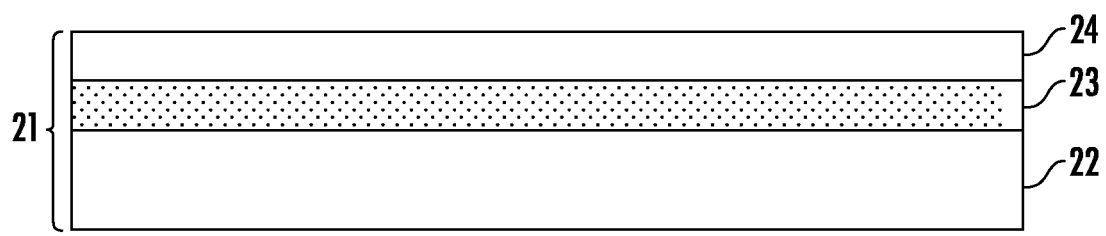
FIGS. 6A-6G are a series of a schematic cross-sectional diagrams illustrating a method of fabricating the ITFET of FIG. 5.
Figure 6B:
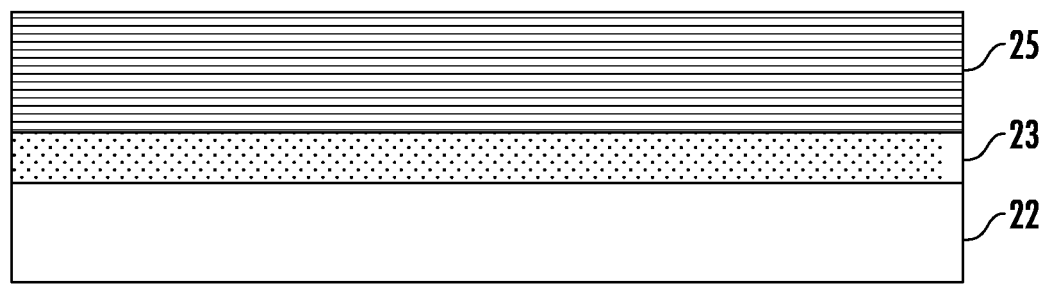

Using the above-described teachings, one can select materials having improved band structures for specific purposes. Turning now to FIGS. 5-6G, the illustrated example is a superlattice 25 material in an Inverted T channel Field Effect Transistor (ITFET) 20. By way of background, planar CMOS devices may continue to suffer from gate control issues as device sizes continue to shrink and gate oxide thicknesses are scaled down. In particular, this is due to the increased gate leakage problems with ultra-thin gates. One approach to addressing this problem is to use a FINFET structure, which provides greater control over the channel region of the device due to its geometry.

Another structure that may help to reduce gate leakage is the ITFET. By way of background, ITFETs are generally described further in an article by Mathew et al. entitled "Silicon Nanocrystal Non-Volatile Memory for Embedded Memory Scaling," Semiconductor Manufacturing, June 2006, pp. 35-39 incorporated herein by reference it its entirety. An ITFET may potentially enjoy advantages of both the FINFET and planar thin-body SOI devices. This is because the ITFET has both a horizontal and a vertical body for the same transistor, which may alleviate the stability problems associated with the FINFET while increasing the total active area of the device. Yet, ITFET structures and techniques for fabricating ITFETs with advanced semiconductor materials may be desirable in some applications.

In the example implementation, the ITFET 20 may be formed with a superlattice 25 as described above (e.g., an Si/O superlattice, although other materials may be used in different embodiments) as the starting material on a semiconductor-on-insulator (SOI) wafer or substrate 21. The SOI substrate 21 illustratively includes a lower semiconductor layer 22 (e.g., silicon), a buried oxide (BOX) layer 23 (e.g., $SiO_2$), and a relatively thin upper semiconductor (e.g., silicon) layer 24, as seen in FIGS. 6A and 6B. In some embodiments, the semiconductor layer 24 above the BOX layer 23 (FIG. 6A) upon which the superlattice layer 25 is formed may be thinned appropriately (e.g., ultra-thin body (UTB) SOI typically has 8-10 nm of silicon) to enhance the amount of the superlattice layer that will ultimately provide the channel region, as will be appreciated by those skilled in the art.

Figure 6C:
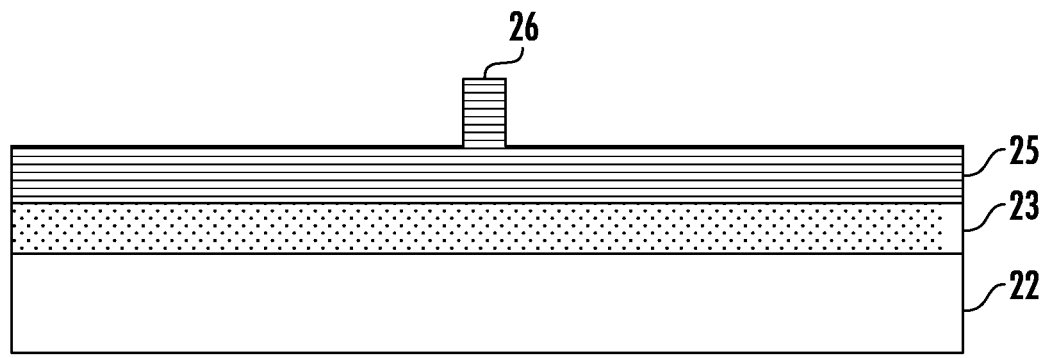
Figure 6D:
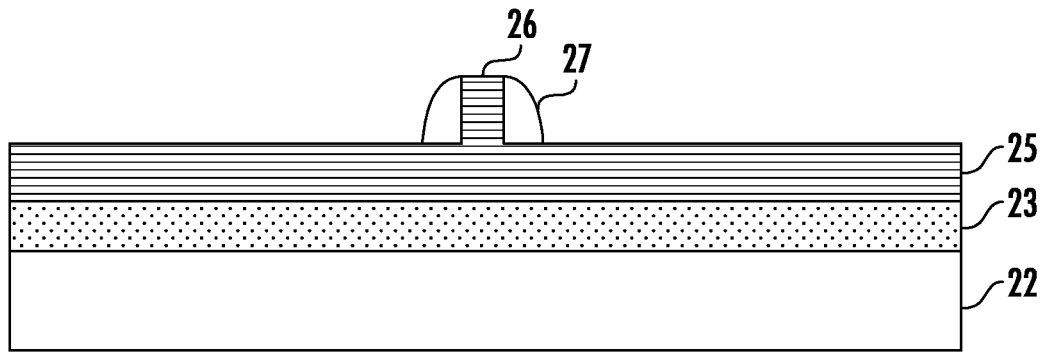
Figure 6E:
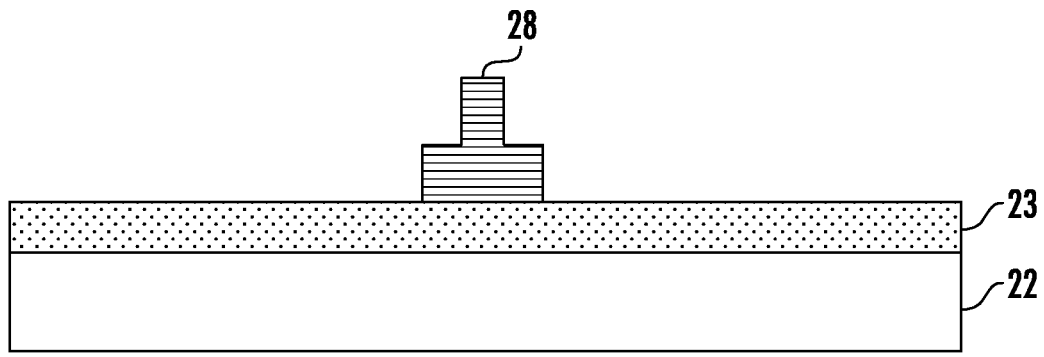
Figure 6F:
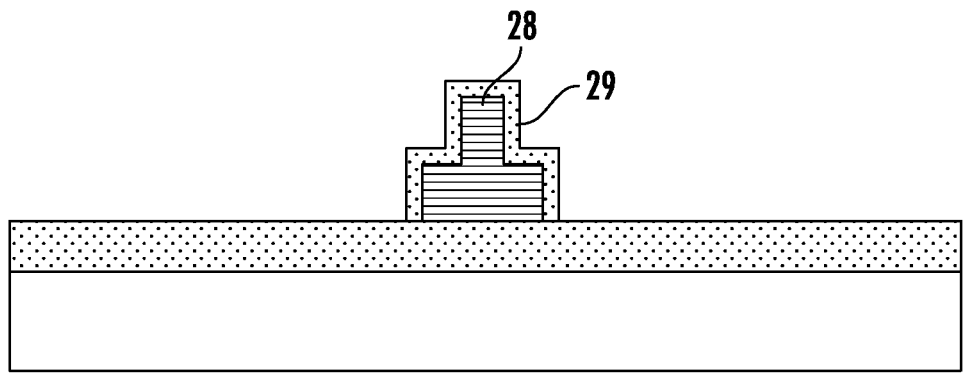
Figure 6G:
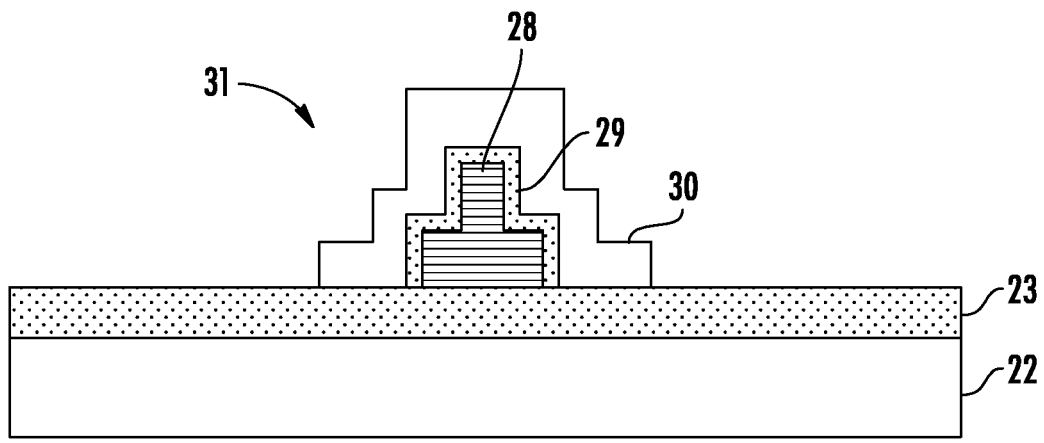

The superlattice layer 25 is then patterned and etched to define one or more fins 26, as seen in FIG. 6C. Spacers 27 (e.g., SiN) are then formed to "mask" the base of the inverted T 28 (FIG. 6D), which is then formed by subsequent etching and/or stripping steps, as seen in FIG. 6E. The gate 31, comprising a gate oxide 29 and gate electrode 30, may then be formed on the inverted T (FIGS. 6F-6G). Thereafter, conventional ITFET processing steps are performed including the formation of spacers, source/drain regions 32, 33, contacts, etc., to produce the final ITFET 20 shown in FIG. 5, as will be appreciated by those skilled in the art.

The above-described high mobility features of the superlattice layer 25 may advantageously provide an ITFET with improved drive current and overall device speed properties. The ITFET would further advantageously retain the above-noted advantages of FINFETs, while also potentially avoiding some of the drawbacks associated therewith, such as mechanical stability, for example.

Many modifications and other embodiments will come to the mind of one skilled in the art having the benefit of the teachings presented in the foregoing descriptions and the associated drawings. Therefore, it is understood that the disclosure is not to be limited to the specific embodiments set forth herein by way of example, and that modifications and embodiments are intended to be included within the scope of the claims.

That which is claimed is:

1. A method for making a semiconductor device comprising:
   forming a superlattice on a substrate, the superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions;
   etching the superlattice to form an inverted T channel;
   forming source and drain regions on opposing ends of the inverted T channel; and
   forming a gate overlying the inverted T channel between the source and drain regions.

2. The method of claim 1 wherein forming the inverted T channel further comprises:
   etching the superlattice to define a fin therein;
   forming sidewall spacers on opposite sides of the fin;
   etching portions of the superlattice laterally outside of the sidewall spacers to define the inverted T channel; and
   removing the sidewall spacers.

3. The method of claim 1 wherein the substrate comprises a semiconductor-on-insulator (SOI) substrate.

4. The method of claim 1 wherein forming the gate comprises forming a gate insulator overlying the inverted T channel, and forming a gate electrode overlying the gate insulator.

5. The method of claim 1 wherein the base semiconductor monolayers comprise silicon.

6. The method of claim 1 wherein each base semiconductor portion comprises a base semiconductor selected from the group consisting of Group IV semiconductors, Group III-V semiconductors, and Group II-VI semiconductors.

7. The method of claim 1 wherein the at least one non-semiconductor monolayer comprises oxygen.

8. The method of claim 1 wherein the at least one non-semiconductor monolayer comprises a non- semiconductor selected from the group consisting of oxygen, nitrogen, fluorine, and carbon-oxygen.

9. The method of claim 1 wherein all of the base semiconductor portions are a same number of monolayers thick.

10. The method of claim 1 wherein at least some of the base semiconductor portions are a different number of monolayers thick.

11. A method for making a semiconductor device comprising:
    forming a superlattice on a semiconductor-on-insulator (SOI) substrate, the superlattice comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions;
    etching the superlattice to form an inverted T channel;
    forming source and drain regions on opposing ends of the inverted T channel; and
    forming a gate overlying the inverted T channel between the source and drain regions by forming a gate insulator overlying the inverted T channel, and forming a gate electrode overlying the gate insulator.

12. The method of claim 11 wherein forming the inverted T channel further comprises:
    etching the superlattice to define a fin therein;
    forming sidewall spacers on opposite sides of the fin;
    etching portions of the superlattice laterally outside of the sidewall spacers to define the inverted T channel; and
    removing the sidewall spacers.

13. The method of claim 11 wherein the base semiconductor monolayers comprise silicon.

14. The method of claim 11 wherein each base semiconductor portion comprises a base semiconductor selected from the group consisting of Group IV semiconductors, Group III-V semiconductors, and Group II-VI semiconductors.

15. The method of claim 11 wherein the at least one non-semiconductor monolayer comprises oxygen.

16. The method of claim 11 wherein the at least one non-semiconductor monolayer comprises a non-semiconductor selected from the group consisting of oxygen, nitrogen, fluorine, and carbon-oxygen.

17. The method of claim 11 wherein all of the base semiconductor portions are a same number of monolayers thick.

18. The method of claim 11 wherein at least some of the base semiconductor portions are a different number of monolayers thick.

19. A method for making a semiconductor device comprising:
    forming a superlattice on a substrate, the superlattice comprising a plurality of stacked groups of layers, each group of layers comprising a plurality of stacked base silicon monolayers defining a base silicon portion, and at least one oxygen monolayer constrained within a crystal lattice of adjacent base silicon portions;
    etching the superlattice to form an inverted T channel;
    forming source and drain regions on opposing ends of the inverted T channel; and
    forming a gate overlying the inverted T channel between the source and drain regions.

20. The method of claim 19 wherein forming the inverted T channel further comprises:
    etching the superlattice to define a fin therein;
    forming sidewall spacers on opposite sides of the fin;

etching portions of the superlattice laterally outside of the sidewall spacers to define the inverted T channel; and removing the sidewall spacers.

21. The method of claim 19 wherein the substrate comprises a semiconductor-on-insulator (SOI) substrate.

22. The method of claim 19 wherein forming the gate comprises forming a gate insulator overlying the inverted T channel, and forming a gate electrode overlying the gate insulator.

23. The method of claim 19 wherein all of the base semiconductor portions are a same number of monolayers thick.

24. The method of claim 19 wherein at least some of the base semiconductor portions are a different number of monolayers thick.

* * * * *